«12» United States Patent
Yan

(10) Patent No.: US 7,420,420 B2
(45) Date of Patent: Sep. 2, 2008

(54) FET BIAS CIRCUIT

(76) Inventor: Yuejun Yan, Unit E & F, 16/F West, Aidi Bldg., Binhe Road, Futian District, Shenzhen (CN) 518045

( * ) Notice: Subject to any disclaimer, the term of this patent is extended or adjusted under 35 U.S.C. 154(b) by 100 days.

(21) Appl. No.: 11/568,457

(22) PCT Filed: Apr. 18, 2005

(86) PCT No.: PCT/CN2005/000516

§ 371 (c)(1),
(2), (4) Date: Oct. 29, 2006

(87) PCT Pub. No.: WO2006/012784

PCT Pub. Date: Feb. 9, 2006

(65) Prior Publication Data

US 2007/0229153 A1    Oct. 4, 2007

(30) Foreign Application Priority Data

Aug. 2, 2004    (CN) .......................... 2004 1 0056160

(51) Int. Cl.
*H03F 3/04* (2006.01)
(52) U.S. Cl. ..................... 330/296; 330/277; 330/311
(58) Field of Classification Search .................. 330/296, 330/277, 311
See application file for complete search history.

(56) References Cited

U.S. PATENT DOCUMENTS 5,757,237 A * 5/1998 Staudinger et al. .......... 330/296
6,046,642 A * 4/2000 Brayton et al. .............. 330/296
6,201,444 B1 * 3/2001 Sevic et al. .................. 330/288
6,566,954 B2 * 5/2003 Miyazawa ................... 330/285
6,753,734 B2 * 6/2004 Arell et al. .................. 330/296
6,956,437 B2 * 10/2005 Lopez et al. ................ 330/296

* cited by examiner

*Primary Examiner*—Patricia Nguyen
(74) *Attorney, Agent, or Firm*—Matthias Scholl P.C.; Matthias Scholl

(57) ABSTRACT

The present invention discloses an FET (Field Effect Transistor) bias circuit comprising a current-changing information circuit having a power source, a resistor connected to the signal output end of this circuit, the other end of the resistor connected to a reference voltage source, and the node between the resistor and the current-changing information circuit acting as the output end providing voltage-changing information; and a voltage divider circuit connected to at least one voltage source, and connected to the output end providing the voltage-changing information; the current in a signal FET is controlled by providing the voltage-changing information at the output end to the voltage divider circuit, and getting a dividing voltage from the voltage divider circuit as an output end of the FET bias circuit. The bias circuit of the present invention causes the static drain current of the signal FET to remain constant, and reduces the variation of the static drain current of the signal FET of each chip made from an entire wafer. Its cost is low, its size is small, and it is easy to be integrated and fabricated.

17 Claims, 6 Drawing Sheets

FET BIAS CIRCUIT

CROSS-REFERENCE TO RELATED APPLICATIONS

This is a National Stage Application of International Patent Application No. PCT/CN 2005/000516 with an international filing date of Apr. 18, 2005, which is based on Chinese Patent Application No. 200410056160.4, filed Aug. 2, 2004. The contents of both of these specifications are incorporated herein by reference.

BACKGROUND OF THE INVENTION

1. Field of the Invention

This invention relates to an FET (Field Effect Transistor) bias circuit, and specifically to a highly-efficient FET bias circuit capable of overcoming static drain current variations of an FET due to temperature variations, lowering the variations of the gain and the linear characteristics of an FET due to temperature variations, as well as reducing the distributional variations of the static gain current of FETs manufactured at different portions of a silicon wafer.

2. Description of the Related Art

When designing a circuit comprising an FET (Field Effect Transistor), the following factors need to be considered: 1) the need to suppress the deterioration of the characteristics of the electronic device due to temperature variations caused by the ambient temperature and by self-heating of the FET; and 2) the need to reduce the variations of the static drain current of FETs manufactured at different portions of a silicon wafer. To compensate for these variations, conventional circuits rely on sacrificing power of the FETs by controlling the voltage at the gate wherein the necessary voltage change is determined by connecting a resistor in series with the drain or with the source and monitoring the changes in current.

In an FET device where a small signal level is required, the static drain current is generally stabilized by applying the self-biasing of the signal FET or by connecting a resistance to the source or the drain of the FET. These solutions are tolerable to the operation of the FET where the power consumption of the device is low or where the requirement for the efficiency is low. However, they do not work for large FET devices where high efficiency is required. This is because when the static drain current is stabilized by self-biasing or by a resistor connected to the source or the drain of the FET, once the resistor is connected in series, the current flowing through the resistor will certainly result in the loss of power applied to the FET.

BRIEF SUMMARY OF THE INVENTION

The present invention arose in the context of the above problems, and it is an object of the present invention to provide a highly-efficient FET bias circuit capable of overcoming the changes of the static drain current of the signal FET due to temperature variations and improving the variation of the static drain current of FETs manufactured at different portions of a silicon wafer.

To achieve the above objective, in accordance with one aspect of the present invention, there is provided a bias circuit, comprising a current-changing information circuit having a power source, a resistor connected to the signal output end of this circuit, the other end of the resistor being connected to a reference voltage source, and a node between the resistor and the current-changing information circuit acting as the output end providing the voltage-changing information; and a voltage divider circuit connected with at least one voltage source, and connected to the output end providing voltage-changing information; wherein the static drain current in an FET is controlled by providing the voltage changing information at the output end to the voltage divider circuit, and getting a dividing voltage from the voltage divider circuit as an output end of the FET bias circuit.

As a result, by employing the FET bias circuit of the present invention, besides the fact that the static drain current is kept constant when temperature varies, the variations in the gain and the linear characteristics due to the variation of the static drain current can also be decreased. Moreover, the circuit of the present invention can be fabricated and integrated, without limitation, together with an FET into the same chip; it can also be fabricated and employed as a separate device. In addition, the circuit of the present invention provides the features of: minimal circuit size and power consumption, such that it can be integrated together with the FET into a same IC chip or be packaged together into the same case, low cost, and ease of fabrication and integration.

DETAILED DESCRIPTION OF THE PREFERRED EMBODIMENTS

Preferred embodiments of the present invention will hereinafter be described in more detail with reference to the accompanying drawings.

Figure 1:
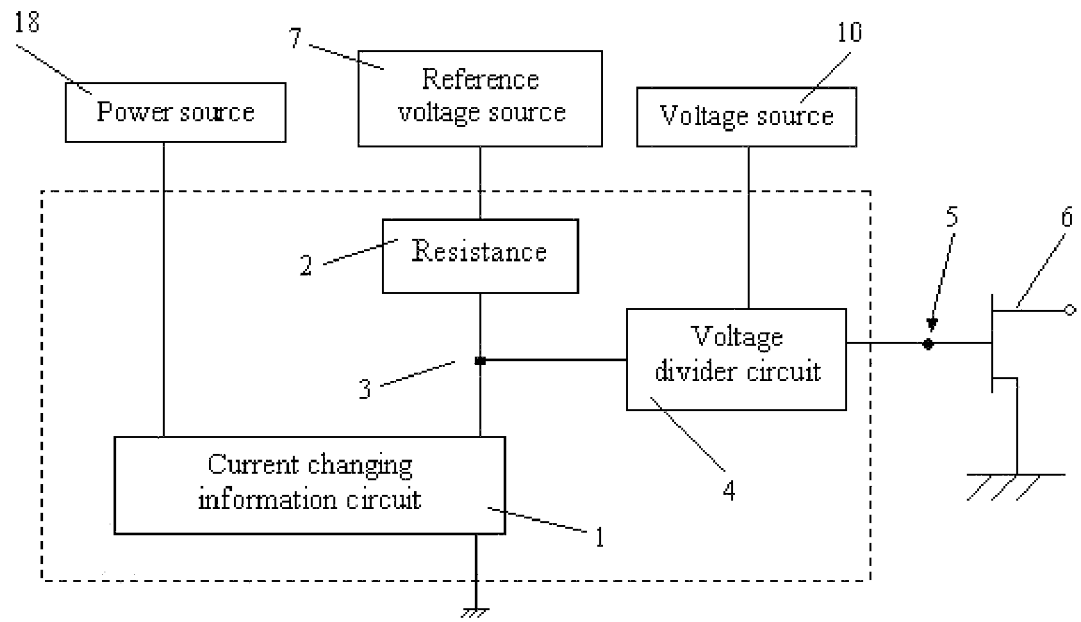
FIG. 1 is a circuit diagram of an FET bias circuit in accordance with the present invention.

FIG. 1 shows a block diagram of an FET bias circuit in accordance with the present invention with a voltage-changing information circuit comprising a current-changing information circuit 1; a resistor 2; and a voltage divider circuit 4 connected to the voltage-changing information circuit; wherein the current-changing information circuit 1 comprises an FET having a minimal power consumption; and the current-changing information circuit 1 is powered by a power source 18. One end of the resistor 2 is connected to the signal output end of the current-changing information circuit 1, and the other end is connected to a reference voltage source 7. The node between the current-changing information circuit 1 and the resistor 2 acts as the output end 3 of the voltage-changing information circuit. The FET 6 is controlled by providing the voltage-changing information at the output end 3 to a voltage divider circuit 4 connected to at least one voltage source 10, and getting a dividing voltage from the voltage divider circuit 4 to serve as an output end 5 of the FET bias circuit of the present invention. The supply voltage source to the voltage divider circuit 4 is a positive or a negative power source as determined by the voltage operation conditions required at the gate of the FET 6, wherein the voltage divider circuit 4 is configured by calculating the potential and its variation at the output end 5 of the voltage divider circuit 4.

In accordance with the circuit of the present invention, since the principles relied for reducing the variations of the static drain current of FETs 6 fabricated at different positions of a silicon wafer are the same as those relied on for temperature compensation, the embodiments of the present invention will be described hereinafter only with reference to the principles for the temperature compensation.

Figure 2:
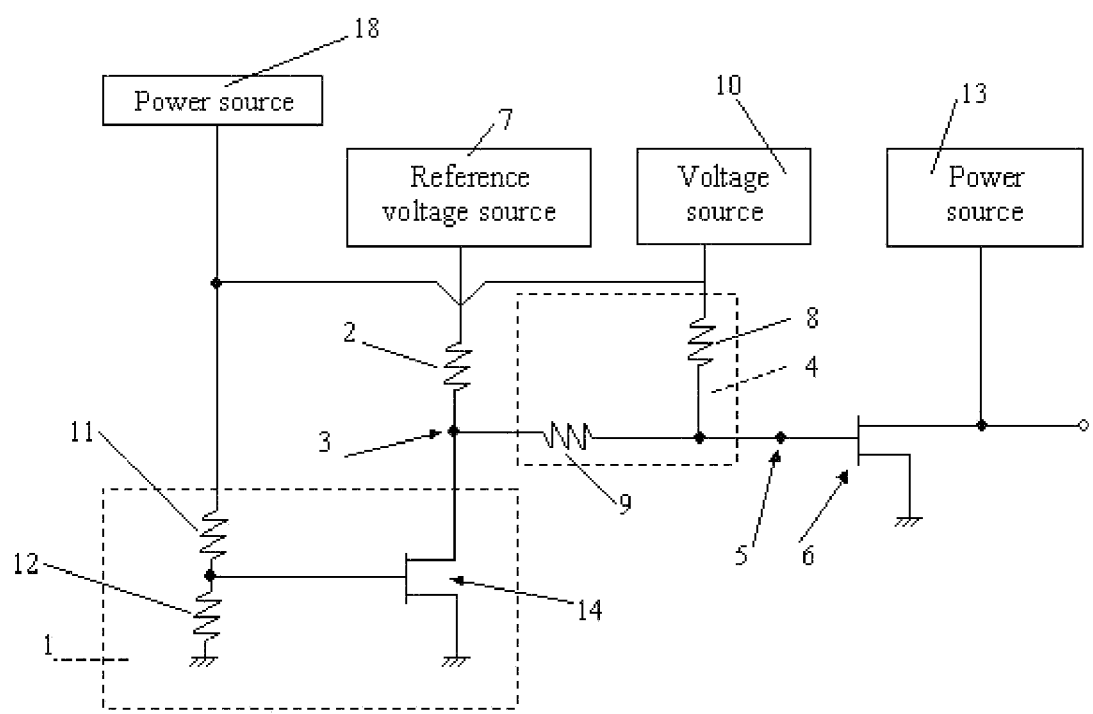
FIG. 2 is a circuit diagram of an FET bias circuit in accordance with a first embodiment of the present invention.

FIG. 2 shows an FET bias circuit of a first embodiment in accordance with the present invention. In the present embodiment, a current changing information circuit 1 comprises an FET 14 and two voltage divider resistors 11, 12 connected in series; wherein, the source of the FET 14 is grounded; the drain is connected to a reference voltage source 7 by means of a resistor 2; the gate is connected to a position between the resistor 11 and the resistor 12; one end of the resistor series 11, 12 is grounded, the other end is connected to a power source 18, which is sharing the same supply with the voltage source 10, and which is applied to the gate of the FET 14 via voltage divider resistors 11, 12, thereby setting the static drain current of the FET 14. The node between the current-changing information circuit 1 and the resistor 2 acts as an output end 3 providing voltage-changing information is connected to a voltage divider circuit 4 having two resistors 8, 9 connected in series; wherein one end of the resistor 8 is connected to the voltage source 10, the other end is connected to one end of the resistor 9, the other end of the resistor 9 being connected to the output end 3 of the voltage-changing information circuit; an output end 5 extended from a node between resistors 8 and 9 is connected to the gate of the FET 6, so as to control the static drain current of the signal FET 6; and the drain of the signal FET 6 is powered by a power source 13.

In addition, the same effect is also achieved by replacing the FET 14 in above current-changing information circuit 1 with a transistor.

Figure 3:
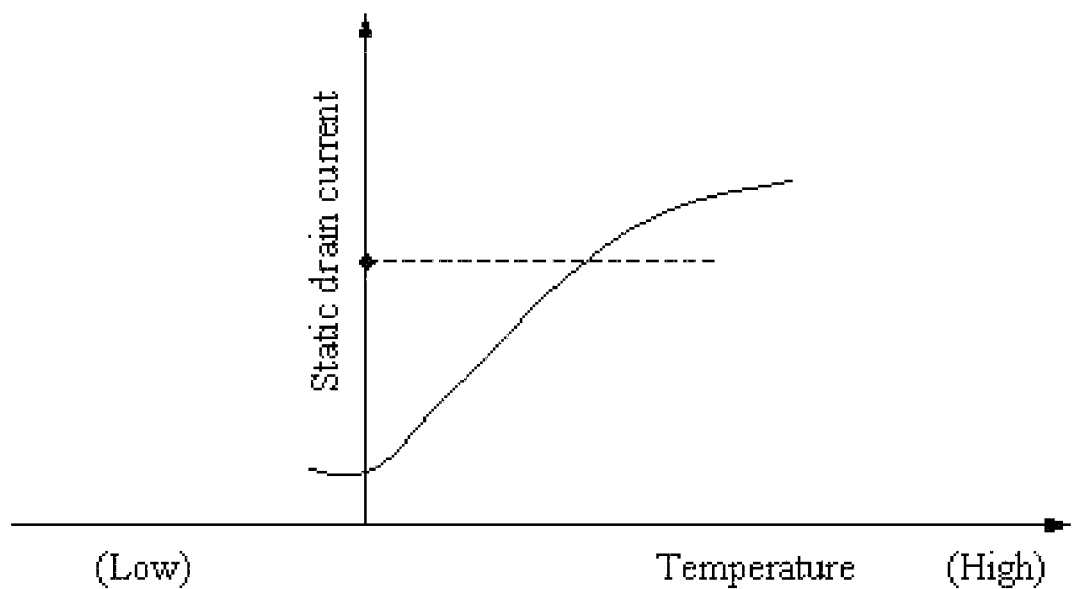
FIG. 3 is a curve of the temperature characteristics of the static drain current of an FET.

FIG. 3 shows a curve of the temperature characteristics of the static drain current of an FET. As shown in FIG. 3, it is evident that, under conditions without temperature compensation, the static drain current of the FET 6 increases with the increase in temperature.

Figure 4:
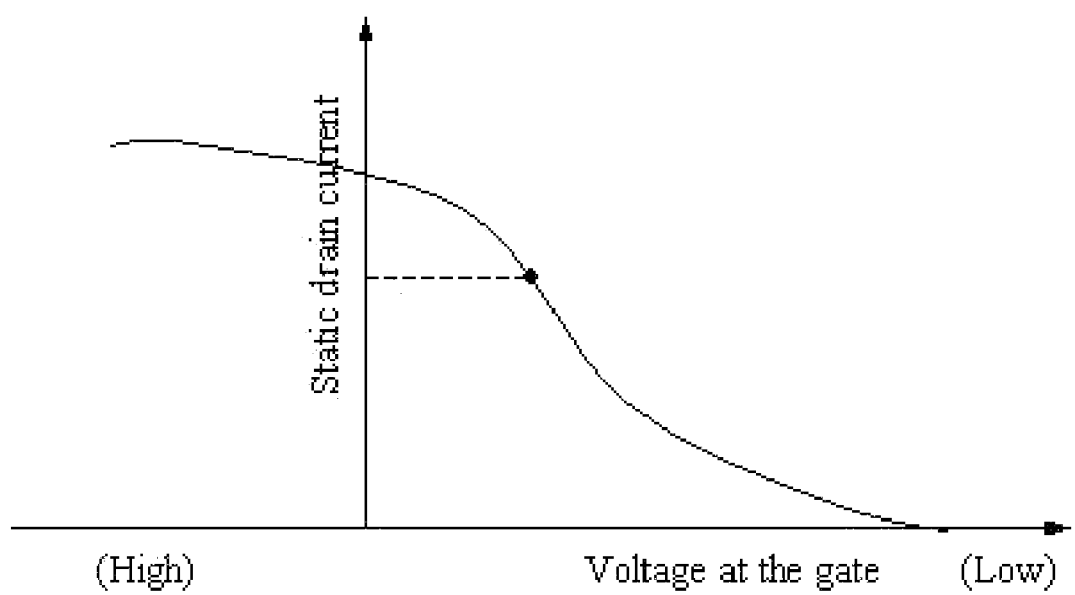
FIG. 4 is a curve showing that, without temperature compensation, the static drain current of an FET decreases with the decrease of the voltage at the gate.

FIG. 4 shows that, at a constant temperature and without temperature compensation, the static drain current of the FET 6 decreases with the decrease of the voltage at the gate.

The characteristic principles presented in FIG. 3 and FIG. 4 are adopted by the present invention, wherein when the temperature varies, the variation of the static drain current of the signal FET 6 is suppressed by adjusting the voltage applied to the gate of the FET 6.

In accordance with the curve of the temperature characteristics of the static drain current shown in FIG. 3, as the temperature increases, the static drain current of the FET 14 in the current-changing information circuit 1 in the present embodiment increases, and the resistance decreases. Thus, the potential at the output end 3 of the voltage-changing information decreases, and the potential at the output end 5 of the voltage divider circuit 4 decreases respectively. Therefore, in accordance with the curve shown in FIG. 4 illustrating that the static drain current of the FET 6 decreases with the decrease of the voltage of the gate, if the decreased potential applied to the gate of the FET 6 can exactly suppresses and counteracts the increase of the static drain current of the FET 6, then the compensation of the temperature is achieved, as follows:

Suppose that at room temperature of 25° C. the target value set for the static drain current of the FET 6 is 100 mA and the negative voltage applied to the gate of the FET 14 in the current-changing information circuit 1 is −0.8 V. In accordance with the circuit design of the present invention, the voltage at the output end 3 providing the voltage-changing information in the current-changing information circuit 1 connected with the resistor 2 in series would be 2 V, the voltage applied to the FET 6 by the voltage divider circuit 4 would be −0.6 V, and the static drain current of the corresponding FET 6 would be as expected 100 mA.

Suppose now that if the temperature increases to 85° C., the static drain current of the FET 6 would increase to 180 mA without employing an FET bias circuit of the present invention, whereas it is expected to remain constant at 100 mA. If the FET bias circuit of the present invention is employed, in accordance with the principles shown in FIG. 3 and FIG. 4, the static drain current of the FET 14 increases with increased temperature, the output current of the current-changing information circuit 1 also increases, thus increasing the voltage drop on the resistor 2. Since the voltage of the reference voltage source 7 is kept constant, the voltage at the output end 3 of the voltage-changing information circuit decreases to 1.6 V, the voltage applied to the gate of the signal FET 6 by the voltage divider circuit 4 changes to −0.8 V, and thus the variation of the voltage at the gate of the signal FET 6 due to the increase of temperature to 85° C. is $\Delta V=-0.8\ V-(-0.6\ V)=-0.2\ V$. Namely, as the temperature rises to 85° C., the decrease of the voltage at the gate of the signal FET 6 is 0.2 V, which is exactly the voltage that should be applied to decrease the static drain current of the signal FET 6 from 180 mA to 100 mA. Accordingly, the static drain current of the signal FET 6 is guaranteed to remain at about 100 mA as the temperature increases from 25° C. to 85° C.

On the other hand, suppose that if the temperature decreases to −30° C., the static drain current of the signal FET 6 would decrease to 50 mA without employing the FET bias circuit of the present invention, whereas it is expected to remain constant at 100 mA.

If the FET bias circuit of the present invention is employed, in accordance with the principles shown in FIG. 3 and FIG. 4, the static drain current of the FET 14 decreases with decreased temperature, the output current of the current-changing information circuit 1 also decreases, thus decreasing the voltage drop on the resistor 2. Since the voltage of the reference voltage source 7 is kept constant, the voltage at the output end 3 of the voltage-changing information circuit increases to 2.4 V, the voltage applied to the gate of the signal FET 6 by the voltage divider circuit 4 changes to −0.42 V, and thus the variation of the voltage at the gate of the signal FET 6 due to the decrease in temperature to −30° C. is ΔV=−0.42 V−(−0.6 V)=−0.18 V. Namely, as the temperature drops to −30° C., the increase of the voltage at the gate of the FET 6 is 0.18 V, which is exactly the voltage that should be applied to increase the static drain current of the FET 6 from 50 mA to 100 mA. Accordingly, the static drain current of the signal FET 6 is guaranteed to remain at about 100 mA as the temperature decreases from 25° C. to −30° C.

Figure 5:
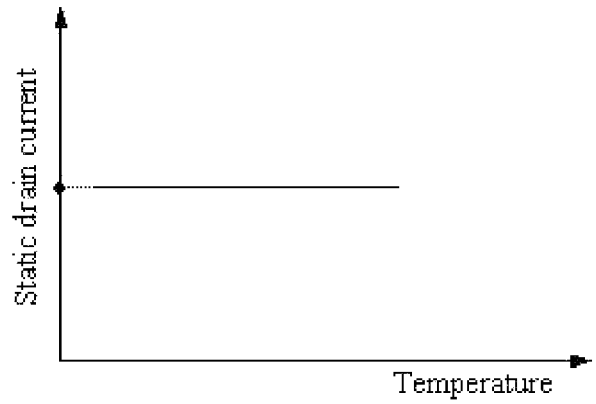
FIG. 5 is a curve of the temperature characteristics of the static drain current of a signal FET where the FET bias circuit of the present invention is utilized.

As described above, the FET bias circuit of the present invention will not result in any additional loss of the signal FET, instead, it allows the signal FET 6 to work efficiently, as well as compensate for temperature variations of the drain current. As shown in FIG. 5, the static drain current of the signal FET 6 is kept constant by embodying the circuit of the present invention even under conditions of temperature variation.

Furthermore, the size and the required voltage of the FET 14, and the value of each resistance in embodiments of the present invention can be designed and determined by taking measurements on an integrated circuit, or by performing a computer simulation of temperature experiments, such that the temperature variations of the static drain current of the FET 6 can be compensated.

Figure 6:
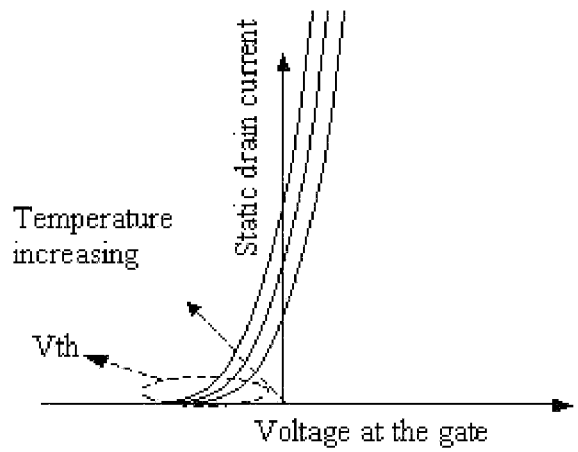
FIG. 6 shows the different values of the threshold voltage of an FET at different temperatures and the characteristic curve of the voltage at the gate of the FET versus the static drain current without utilizing an FET bias circuit of the present invention.

FIG. 6 shows the curve of the voltage at the gate of the FET 6 at different temperatures versus the static drain current without utilizing the FET bias circuit of the present invention, showing that the threshold voltage Vth of the FET 6 assumes different values at different temperatures, and decreases with the increase in the temperature.

Figure 7:
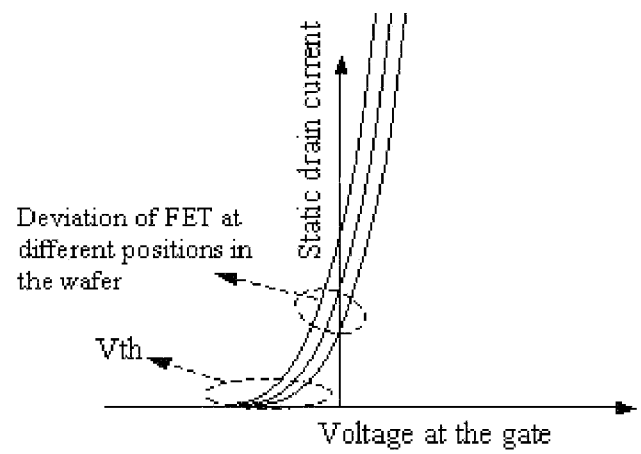
FIG. 7 shows the different values of the threshold voltage of FETs fabricated in integrated circuits at different positions of the entire wafer and a characteristic curve of the voltage at the gate of the FET versus the static drain current without utilizing an FET bias circuit of the present invention.

FIG. 7 shows the characteristic curve of the voltage at the gate of the signal FET 6 versus the static drain current, without employing the FET bias circuit of the present invention, wherein the FETs 6 fabricated in integrated circuits at different positions of the silicon wafer exhibit different threshold voltage.

The characteristics shown in FIG. 6 and those shown in FIG. 7 are quite similar by comparison, and the principles relied on for reducing the variation of the static drain current of the signal FET 6 fabricated at different positions of the entire wafer are quite similar to those shown in FIG. 3, FIG. 4, and FIG. 5, as well; therefore, the description of the former will be omitted.

Figure 8:
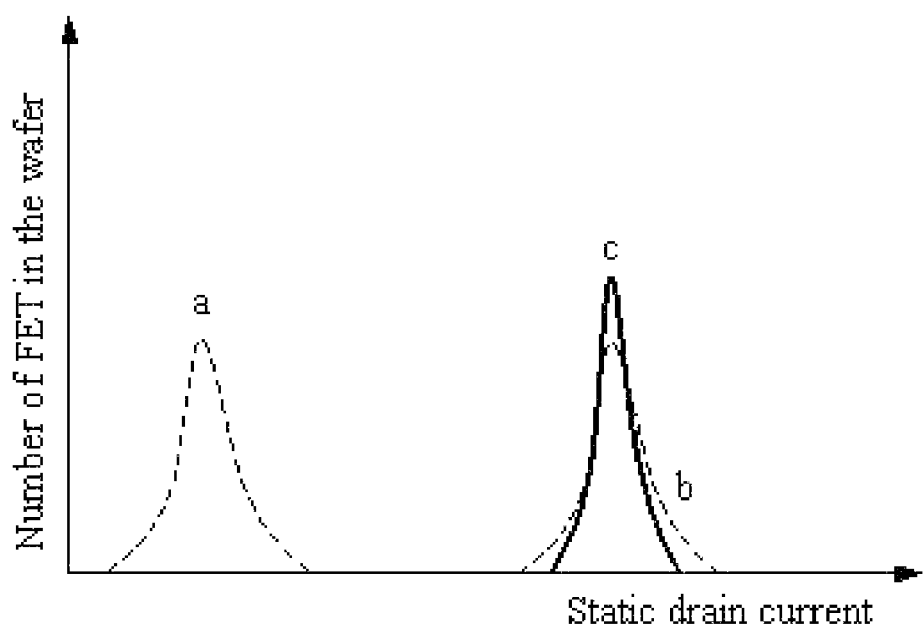
FIG. 8 shows distribution curves of static drain currents of bias circuit FETs made of different parts of an entire silicon wafer and of FETs, and a distribution curve of the controlled signal FET connected to an FET bias circuit of the present invention.

FIG. 8 shows distribution curves of static drain currents of bias circuit FETs 14 made of different parts of the entire silicon wafer and of the signal FETs 6, and a distribution curve of the static drain current of the signal FET 6 connected to an FET bias circuit of the present invention.

As shown in FIG. 8, for a bias circuit FET 14, at a constant temperature and for a given gate voltage, the static drain current of each FET 14 (low power transistor) in the entire integrated circuit will vary following the distribution curve a. Similarly, for an signal FET 6, the static drain current of each FET 6 in the entire integrated circuit will vary following the distribution curve b. The variation of the static drain current of each FET 6 connected to an FET bias circuit of the present invention will be reduced and will follow the distribution curve c. To exemplify, when the FET bias circuit of the present invention is not employed, at a certain gate voltage, the static drain currents of the high-power signal FETs 6A and 6B fabricated from different portions of an entire silicon wafer are 100 mA and 130 mA, respectively. When the bias circuit of the present invention is employed, when the static drain current of the high-power FET 6A is 100 mA, the static drain current of the FET 14A of the bias circuit of the same chip is 1 mA, and the voltages at the output ends 3 and 5 of the voltage-changing information circuit are defined as Vax and Vao, respectively. As to the circuit fabricated by the same technique, the current of the FET 14B in the bias circuit of the high power signal FET 6B is 1.3 mA, which is larger than that of the FET 14A. The voltages at the output ends 3 and 5 of the voltage-changing information circuit are defined to be Vbx and Vbo, respectively. Here, since Vbx<Vax, the voltage at the output ends 5 is Vbo<Vao, which means that the voltage applied to the gate of the high-power FET 6B is lower than that applied to the gate of the high power signal FET 6A, therefore, the static drain current of the high power signal FET 6B will decrease to less than 130 mA. As a result, besides being able to compensate for temperature variations, the FET bias circuit of the present invention also functions to reduce the static drain current variations of high power FETs due to wafer imperfections.

Figure 9:
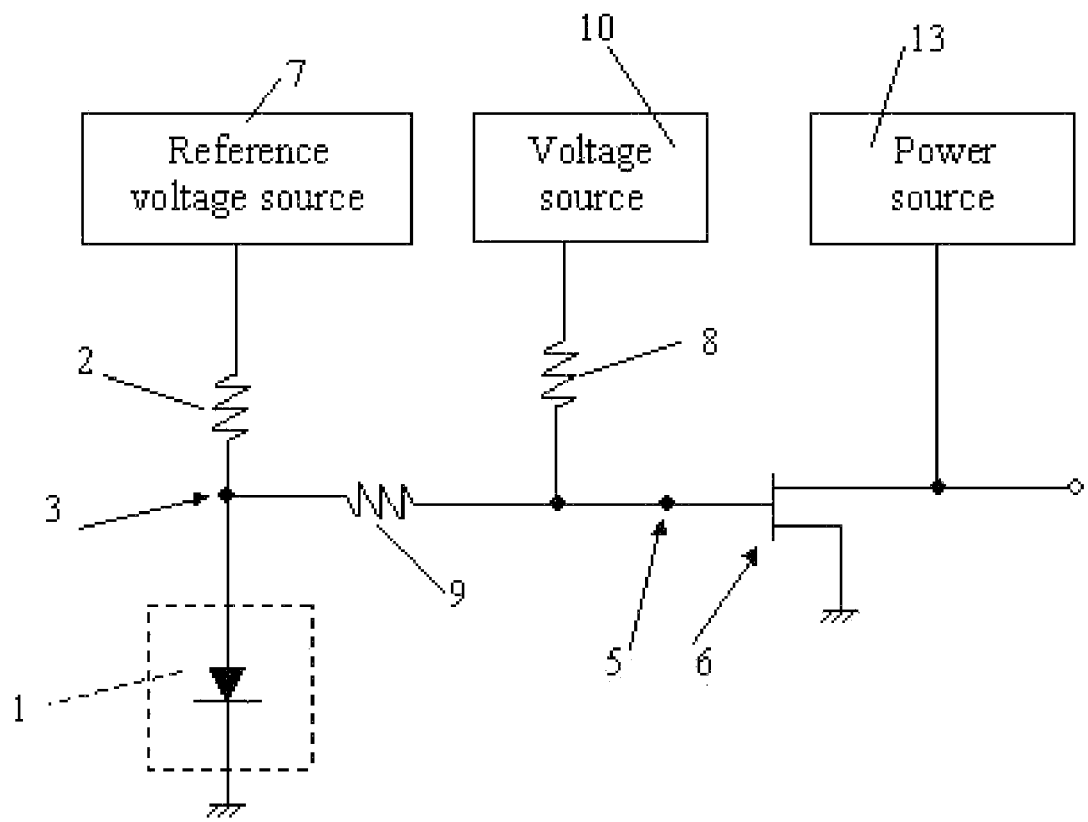
FIG. 9 is a circuit diagram of an FET bias circuit in accordance with a second embodiment of the present invention.

FIG. 9 shows an FET bias circuit of a second embodiment of the present invention, illustrating a similar circuit configuration to that shown in FIG. 2, except that the current-changing information circuit 1 comprises a diode. One end of the diode is grounded, the other end of the diode is connected to one end of a resistor 2, the other end of the resistor 2 is connected to a reference voltage source 7, and the node between the resistor 2 and the diode acts as an output end 3 providing the voltage-changing information. Since the current-changing characteristics of a diode are similar to those of the FET, the function of the present invention can also be realized by associating a diode with the setting of the voltage divider circuit 4. Here, it is not necessary to use the power source 18, and it can be kept in an open state.

Figure 10:
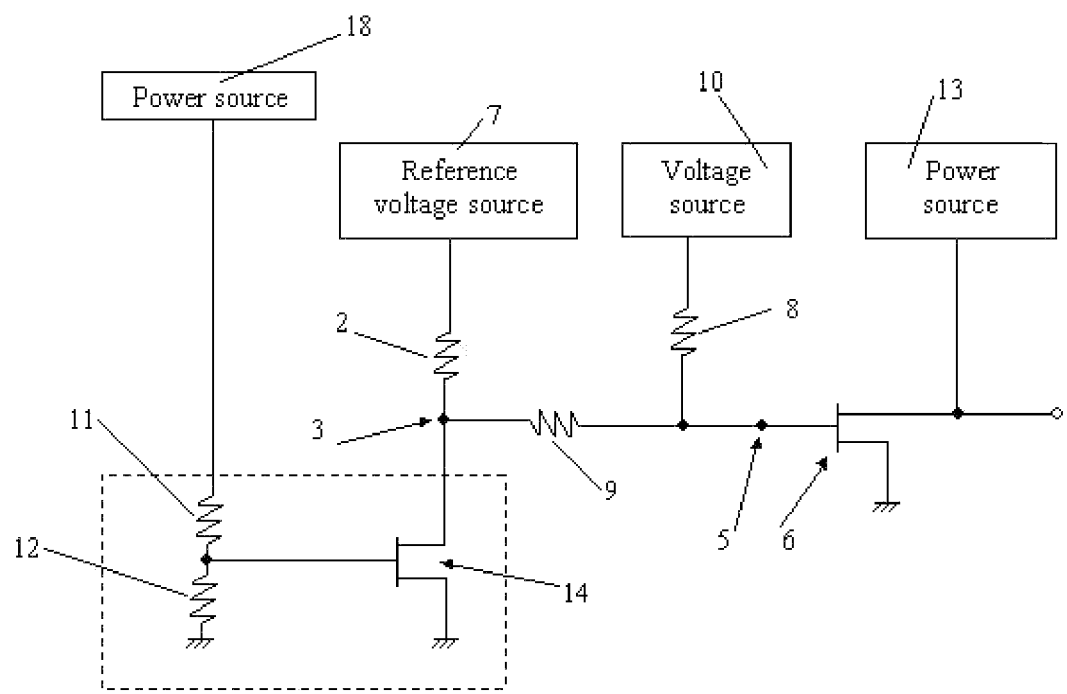
FIG. 10 is a circuit diagram of an FET bias circuit in accordance with a third embodiment of the present invention.

FIG. 10 shows an FET bias circuit of a third embodiment of the present invention, illustrating a similar circuit configuration to that shown in FIG. 2, except that the power source 18 is a separate one.

Figure 11:
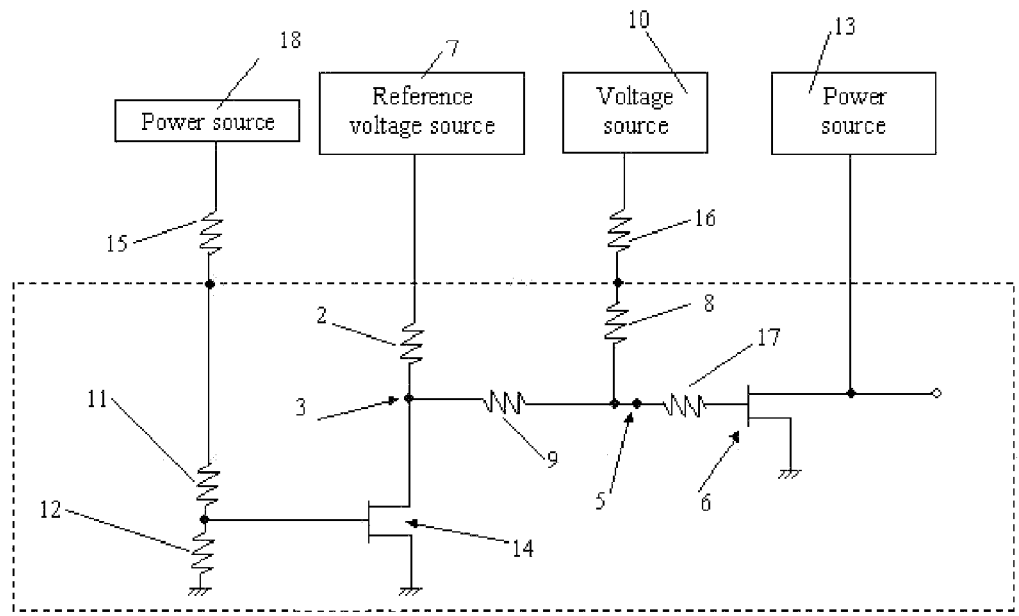
FIG. 11 is a circuit diagram of an FET bias circuit in accordance with an improved embodiment of the present invention.

FIG. 11 is based on the circuit shown in FIG. 10 and illustrates the adjustment of the static drain current of the FET 6 via an external micro-adjustment. The parts within the dashed line are integrated in the IC chip, while resistors 15, 16 shown outside the block are not necessarily so. When the static drain current of the FET 6 deviates from an ideal value due to variations in the process for IC chip fabrication, it can be micro-adjusted by the regulating resistors 15 and/or resistor 16 disposed outside the IC chip. In addition, the resistor 17 disposed inside the IC chip is applied to increase the isolation of components so as to avoid interference of signals from the current-changing information circuit 1 on the FET 6 when the value of the resistor 9 is small.

Figure 12:
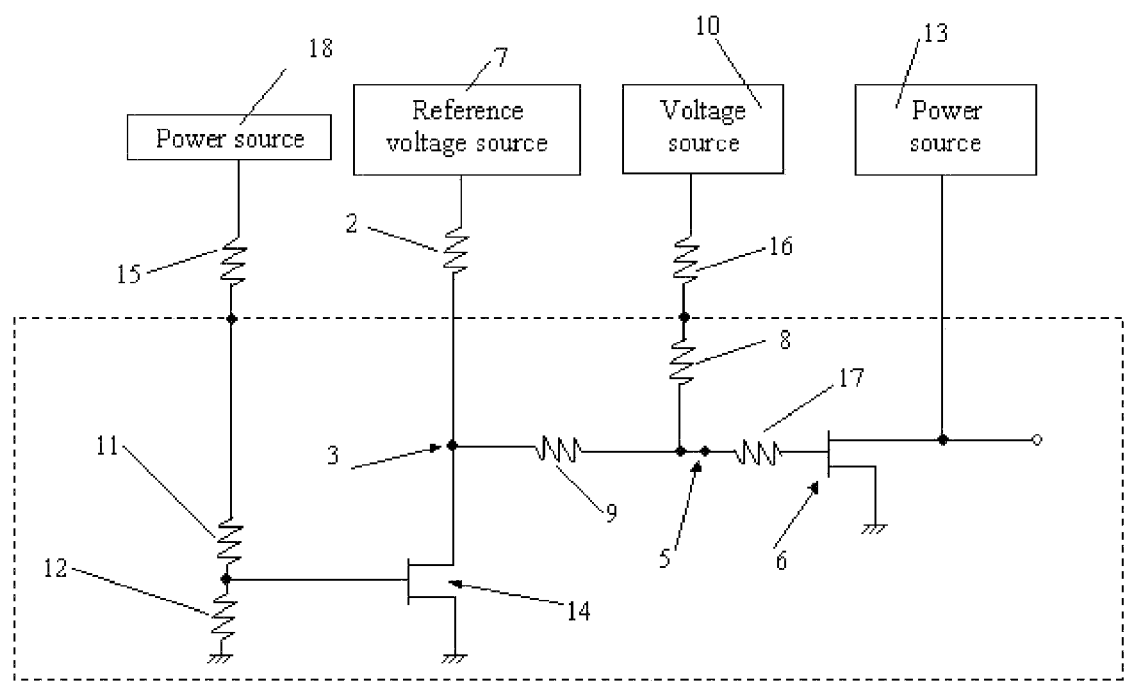
FIG. 12 is a circuit diagram of a FET bias circuit in accordance with another improved embodiment of the present invention.

FIG. 12 shows a configuration wherein the resistor 2 in the bias circuit is disposed outside of the IC chip. Because of variations in the fabrication process, resistance of resistors disposed within the IC chip varies with temperature; however, a resistor having as small of a variation as possible is desired for resistor 2. Therefore, the resistor 2 is disposed outside the IC chip, and by doing so not only the variation of the voltage at the output end 3 of the voltage-changing information circuit but also that at the output end 5 of the FET 6 becomes small.

The circuit provided in the present invention is suitable to be applied in various electronic devices and IC circuits used in electronics and communications, and more particularly, in the circuits used for high frequency communications. The FET bias circuit of the present invention provides the following advantages:

(a) it can compensate the temperature efficiently to the partial characteristics of the signal FET;

(b) it can reduce the deviation of the static drain current of the signal FET of each chip made from different parts of the entire wafer;

(c) the whole circuit has a small size and thus can be integrated together with the FET into the same chip, with simple process, low cost, and high reliability;

(d) it can be packaged together with the FET in a same case;

(e) it can be applied to control the signal FET having a single positive power source, or having a negative power source; and (f) the static drain current of the signal FET can be micro adjusted by the resistance set outside of the IC chip or by applying voltage.

The invention claimed is:

1. A bias circuit for controlling a first field effect transistor comprising:
   a current-changing information circuit having a current-changing information signal output end;
   a voltage divider circuit having a voltage divider circuit signal input end and a voltage divider circuit signal output end;
   a first resistor having a first first resistor end and a second first resistor end;
   a first voltage source;
   a second voltage source; and
   a third voltage source;
   wherein
      said current-changing information circuit is connected to said second voltage source;
      said first first resistor end is connected to said current-changing information signal output end, this connection forming a node between said first resistor and said current-changing information circuit, said node acting as a voltage-changing information signal output end providing voltage-changing information;
      said second first resistor end is connected to said third voltage source;
      said voltage divider circuit is connected to said first voltage source; and
      said voltage divider circuit signal input end is connected to said voltage-changing information signal output end.

2. The bias circuit of claim 1 provided with said first field effect transistor having a first gate, wherein said voltage divider circuit signal output end is connected to said first gate.

3. The bias circuit of claim 1 provided with said first field effect transistor having a first gate, said bias circuit further comprising a second resistor, wherein said second resistor is connected between said voltage divider circuit signal output end and said first gate.

4. The bias circuit of claim 1 wherein
   said current-changing information circuit comprises (a) a second field effect transistor having a second source, a second drain, a second gate, (b) a second resistor having a first second resistor end and a second second resistor end, and (c) a third resistor having a first third resistor end and a second third resistor end;
   said second resistor and said third resistor are connected in series, this connection forming a node between said second and said third resistors;
   said second source is grounded;
   said second drain is connected to said third voltage source across said first resistor;
   said second gate is connected to said node between said second resistor and said third resistor;
   said second third resistor end is grounded; and
   said first second resistor end is connected to said second voltage source.

5. The bias circuit of claim 1 provided with said first field effect transistor in one package.

6. The bias circuit of claim 1 further comprising
   a fifth resistor, said fifth resistor being connected between said second voltage source and said current-changing information circuit; and
   a sixth resistor, said sixth resistor being connected between said first voltage source and said voltage divider circuit;
   wherein
      said current-changing information circuit, said voltage divider circuit, said first resistor, said first voltage source, said second voltage source, and said third voltage source are integrated into an integrated circuit; and
      said fifth resistor and said sixth resistor are not integrated into said integrated circuit.

7. The bias circuit of claim 2 wherein
   said first voltage source connected to said voltage divider circuit is positive or negative as determined by the voltage operation condition required at the first gate; and
   said voltage divider circuit is configured by calculating the signal and its variation at said voltage divider circuit signal output end.

8. The bias circuit of claim 1 wherein said third voltage source, said first voltage source, and said second voltage source are powered by a power supply.

9. A bias circuit for controlling a first field effect transistor comprising:
   a first resistor having a first first resistor end and a second first resistor end;
   a current-changing information circuit comprising a diode having a first diode end and a second diode end;
   a voltage divider circuit having a voltage divider circuit signal input end and a voltage divider circuit signal output end;
   at least one first voltage source;
   a second voltage source; and
   a third voltage source;
   wherein
      said first diode end is grounded;
      said second diode end is connected to said first first resistor end, this connection forming a node between said first resistor and said diode, said node acting as a voltage-changing information signal output end providing voltage-changing information;
      said second first resistor end is connected to said third voltage source;
      said voltage divider circuit is connected to said first voltage source; and
      said voltage divider circuit signal input end is connected to said voltage-changing information signal output end.

10. The bias circuit of claim 1 wherein
    said current-changing information circuit comprises (a) a transistor having an emitter, a collector, and a base, (b) a second resistor having a first second resistor end and a second second resistor end, (c) a third resistor having a first third resistor end and a second third resistor end, and (d) a fourth resistor;
    said second and said third resistors are connected in series, this connection forming a node between said second and said third resistors;
    said emitter is grounded;
    said collector is connected to said third voltage source across said first resistor;
    said base is connected to said node between said second and said third resistors;

said second third resistor end is grounded; and said first second resistor end is connected to said second voltage source.

11. The bias circuit of claim 1 provided with said first field effect transistor, said bias circuit and said first field effect transistor being integrated into one integrated circuit.

12. The bias circuit of claim 1 provided with said first field effect transistor, said bias circuit and said first field effect transistor being fabricated in different integrated circuits.

13. The bias circuit of claim 4 wherein said third voltage source, said first voltage source, and said second voltage source are independent from each other and powered by different power supplies.

14. The bias circuit of claim 1 for use in a method of controlling current of a field effect transistor comprising
   (a) providing a voltage-changing information at said voltage-changing information signal output end of said bias circuit of claim 1; and
   (b) providing a dividing voltage at said voltage divider circuit signal output end of said bias circuit of claim 1.

15. The bias circuit of claim 9 for use in a method of controlling current of a field effect transistor comprising
   (a) providing a voltage-changing information at said voltage-changing information signal output end of the bias circuit of claim 9; and
   (b) providing a dividing voltage at said voltage divider circuit signal output end of the bias circuit of claim 9.

16. The bias circuit of claim 10 for use in a method of controlling current of a field effect transistor comprising
   (a) providing a voltage-changing information at said voltage-changing information signal output end of the bias circuit of claim 10; and
   (b) providing a dividing voltage at said voltage divider circuit signal output end of the bias circuit of claim 10.

17. The bias circuit of claim 3 wherein said first voltage source connected to said voltage divider circuit is positive or negative as determined by the voltage operation condition required at the first gate; and said voltage divider circuit is configured by calculating the signal and its variation at said voltage divider circuit signal output end.

* * * * *